United States Patent
Chuang et al.

(10) Patent No.: US 8,773,894 B2
(45) Date of Patent: Jul. 8, 2014

(54) STATIC RANDOM ACCESS MEMORY WITH RIPPLE BIT LINES/SEARCH LINES FOR IMPROVING CURRENT LEAKAGE/VARIATION TOLERANCE AND DENSITY/PERFORMANCE

(71) Applicant: National Chiao Tung University, Hsinchu (TW)

(72) Inventors: Ching-Te Chuang, New Taipei (TW); Hao-I Yang, Taipei (TW); Chien-Yu Lu, Taichung (TW); Chien-Hen Chen, Kaohsiung (TW); Chi-Shin Chang, Taichung (TW); Po-Tsang Huang, Hsinchu (TW); Shu-Lin Lai, Taichung (TW); Wei Hwang, Hsinchu (TW); Shyh-Jye Jou, Hsinchu (TW); Ming-Hsien Tu, Tainan (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 13/684,784

(22) Filed: Nov. 26, 2012

(65) Prior Publication Data
US 2014/0078818 A1 Mar. 20, 2014

(30) Foreign Application Priority Data
Sep. 14, 2012 (TW) .............................. 101133687 A (51) Int. Cl.
*G11C 11/00* (2006.01)
*G11C 11/412* (2006.01)
*G11C 11/413* (2006.01)
*G11C 11/419* (2006.01)

(52) U.S. Cl.
CPC ............ *G11C 11/412* (2013.01); *G11C 11/413* (2013.01); *G11C 11/419* (2013.01)
USPC ........................................................ 365/154

(58) Field of Classification Search
CPC ... G11C 11/412; G11C 11/413; G11C 11/419
USPC ........................................................ 365/154
See application file for complete search history.

(56) References Cited

U.S. PATENT DOCUMENTS

| 6,038,193 | A | * | 3/2000 | Wang et al. | ............... 365/230.05 |
| 6,704,238 | B2 | * | 3/2004 | Izutsu et al. | ............... 365/230.03 |
| 2013/0064004 | A1 | * | 3/2013 | Garg et al. | ...................... 365/154 |

OTHER PUBLICATIONS

Donald W.Plass and Yuen H. Chan, IBM POWER6 SRAM arrays, The IBM Journal of Research and Development, 2007, p. 747-756, vol. 51, No. 6, International Business Machines Corporation, USA.

(Continued)

*Primary Examiner* — Hoai V Ho
*Assistant Examiner* — Tri Hoang
(74) *Attorney, Agent, or Firm* — Bacon & Thomas, PLLC (57) ABSTRACT

A static random access memory includes a pre-charger, a first cell column array/peripheral circuit, and a first ripple buffer. The pre-charger is connected to a first local bit line in order to pre-charge the first local bit line. The first cell column array/peripheral circuit is connected to the first local bit line and has a plurality of cells for temporarily storing data. The cells are connected to the first local bit line. The first ripple buffer is connected to the first local bit line and a second local bit line in order to send the data from the first local bit line to the second local bit line.

10 Claims, 12 Drawing Sheets

(56) References Cited

OTHER PUBLICATIONS

Keiichi Kushida, Azuma Suzuki, Gou Fukano, Atsushi Kawasumi, Osamu Hirabayashi, Yasuhisa Takeyama, Takahiko Sasaki, Akira Katayama, Yuuki Fujimura and Tomoaki Yabe, A 0.7 V Single-Supply SRAM With 0.495um2 cell in 65nm Technology Utilizing Self-Write-Back Sense Amplifier and Cascaded Bit Line Scheme, VLSI Circuits Digest of Technical Papers, 2008, p. 46-47, Toshiba Corporation, Japan.

Koichi Takeda, Toshio Saito, Shinobu Asayama, Yoshiharu Aimoto, Hiroyuki Kobatake, Shinya Ito, Toshifumi Takahashi, Masahiro Nomura, Kiyoshi Takeuchi and Yoshihiro Hayashi, Multi-Step Word-Line Control Technology in Hierarchical Cell Architecture for Scaled-Down High-Density SRAMs, IEEE Journal of Solid-State Circuits, 2011, p. 806-814, vol. 46, No. 4, Japan.

* cited by examiner

STATIC RANDOM ACCESS MEMORY WITH RIPPLE BIT LINES/SEARCH LINES FOR IMPROVING CURRENT LEAKAGE/VARIATION TOLERANCE AND DENSITY/PERFORMANCE

CROSS REFERENCE TO RELATED APPLICATION

This application claims the benefit of the Taiwan Patent Application Serial Number 101133687, filed on Sep. 14, 2012, the subject matter of which is incorporated herein by reference.

BACKGROUND OF THE INVENTION

1. Field of the Invention

The present invention relates to the technical field of static random access memories and, more particularly, to a static random access memory with ripple bit lines or search lines for improving nanometer-level current leakage and variation tolerance as well as density and performance.

2. Description of Related Art

With advanced semiconductor processes, such as a process of lower than 100 nm, it has a sufficient potential to carry out a low voltage, low power, and low density static random access memory (SRAM). However, the variations of the process, applied voltage and temperature can impact on the advanced semiconductor process. The variations can reduce the stability of the SRAM. For example, a read-disturb of the SRAM can reduce the read static noise margin (RSNM) and thus negatively influence the reading stability.

Figure 1:
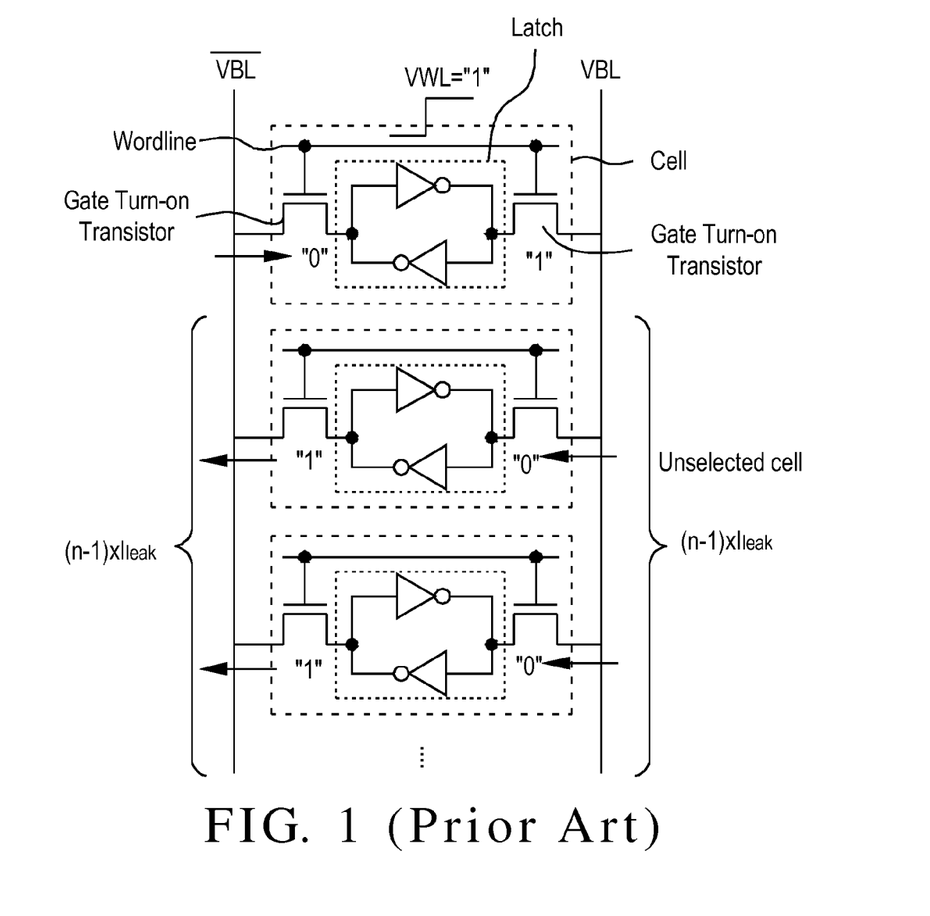
FIG. 1 is a schematic diagram of a typical static random access memory.

FIG. 1 is a schematic diagram of a typical static random access memory. As shown in FIG. 1, the SRAM includes a cell column array with a plurality of rows, each having a plurality of cells connected to another word line. The voltage of each word line is controlled by a word line driver corresponding to the word line. Each cell is implemented with a latch and at least one gate turn-on transistor. The latch is formed of a pair of cross-coupled inverters, and has two storage nodes. The transistor has a control terminal (e.g., gate) connected to the word line, and two channel terminals (e.g., source and drain) connected to one of the two storage nodes and a corresponding bit line respectively.

For reading a cell column array and a cell on the cell column array, the bit line (VBL, $\overline{VBL}$) of the transistor is pre-charged to a high voltage with logic 1. The word line (VWL) of the cell column array and the transistor of the cell are enabled by the word line driver to thereby turn on the storage node to the bit line (VBL, $\overline{VBL}$). If the storage node stores a low voltage with logic 0, the latch of the cell discharges the pre-charged high voltage to the low voltage with logic 0.

The SRAM has a higher and higher density as the bit line (VBL, $\overline{VBL}$) connects more and more cells. In this case, the current leakage is accordingly increased more and more. Namely, the data pre-charged in the selected bit line can be influenced easily by the leakage of other cells, resulting in reducing the sense margin.

Figure 2:
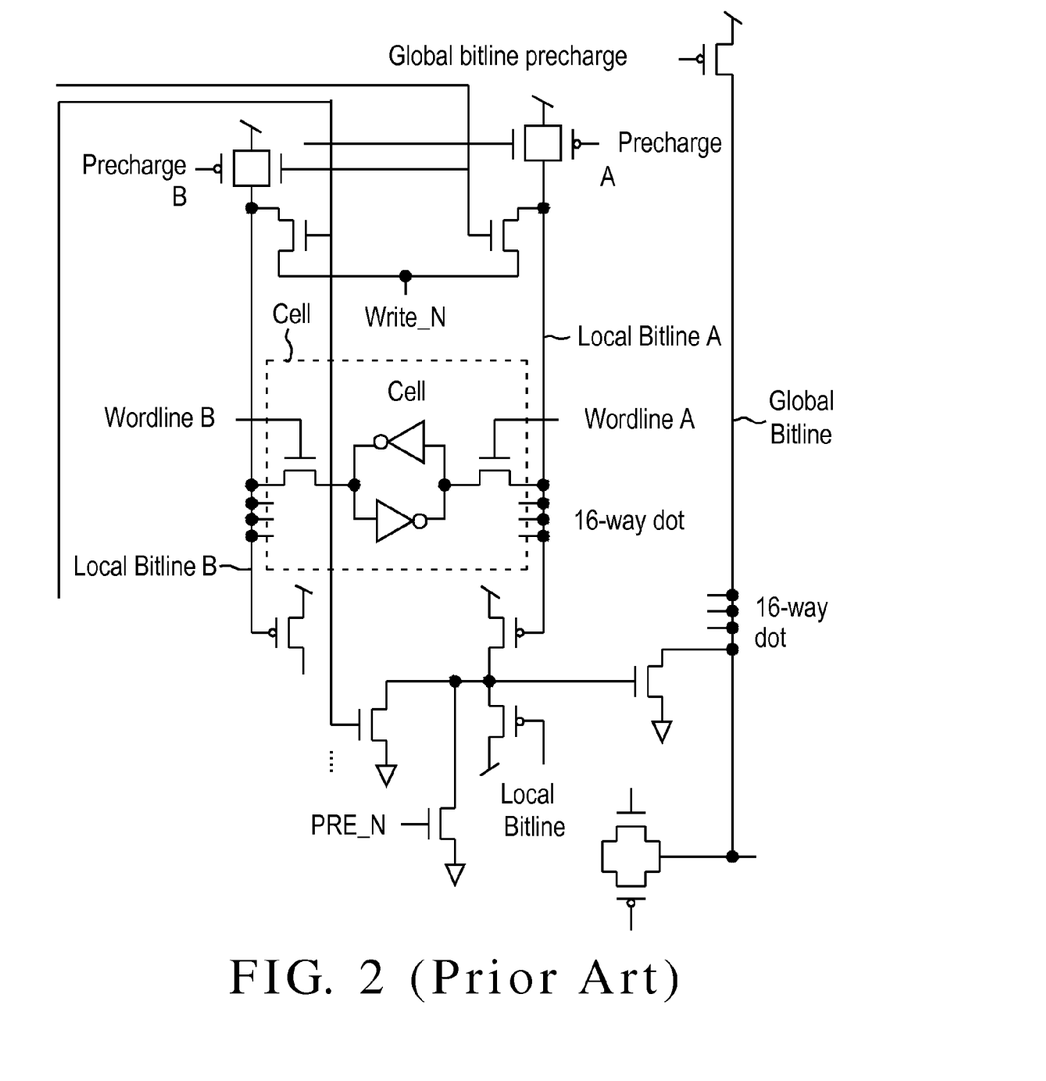
FIG. 2 schematically illustrates the operation of local bit lines with a global bit line.

To overcome this, the article "IBM POWER6 SRAM arrays" issued by D. W. Plass and Y. H. Chan in IBM J. Res. & Dev. Vol. 51, No. 6, November 2007, pp. 747-756 has proposed a bit line (BL) without connecting excessive SRAM cells in order to avoid read disturbance and large bit line leakage, and the shorter local bit lines (LBLs) are operated with a global bit line (GBL), as shown in FIG. 2. Since the shorter LBLs are used, the advantages of better sense margin, less read disturbance, and improved process variation and current leakage tolerance are obtained. However, when an LBL is connected to the GBL through a multiplexer, it increases the chip area, and an additional metal layer is required for the GBL.

Figure 3:
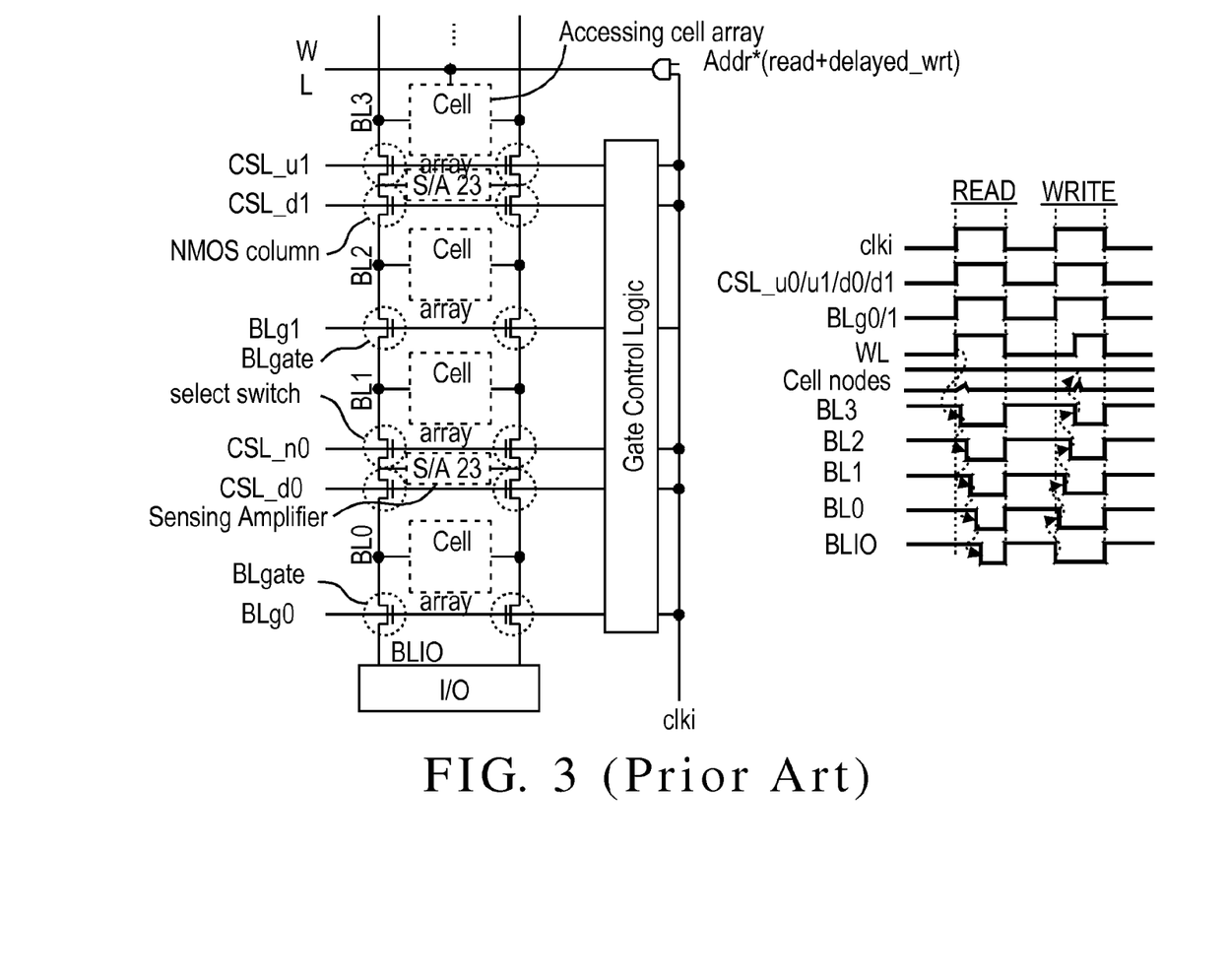
FIG. 3 schematically illustrates the use of another local bit line.

The article "A 0.7V Single-Supply SRAM with 0.495 μm² cell in 65 nm technology utilizing Self-Write-Back Sense Amplifier and Cascaded Bit Line Scheme" issued by K. Kushida et al. in Symp. VLSI Circuits, 2008, pp. 46-47 has proposed the transistors CSL_d0 and CSL_u0 to separate one from another LBL to thereby obtain the advantages of better sense margin, process variance, and current leakage without adding the metal layer for the GBL, as shown in FIG. 3. However, a local sensing amplifier is required and added between the transistors CSL_d0, CSL_u0, and accurately controlling the transistors CSL_d0, CSL_u0 to be on/off is required, which causes a more complicated gate control logic circuitry and an accessing speed limit to the SRAM.

Figure 4:
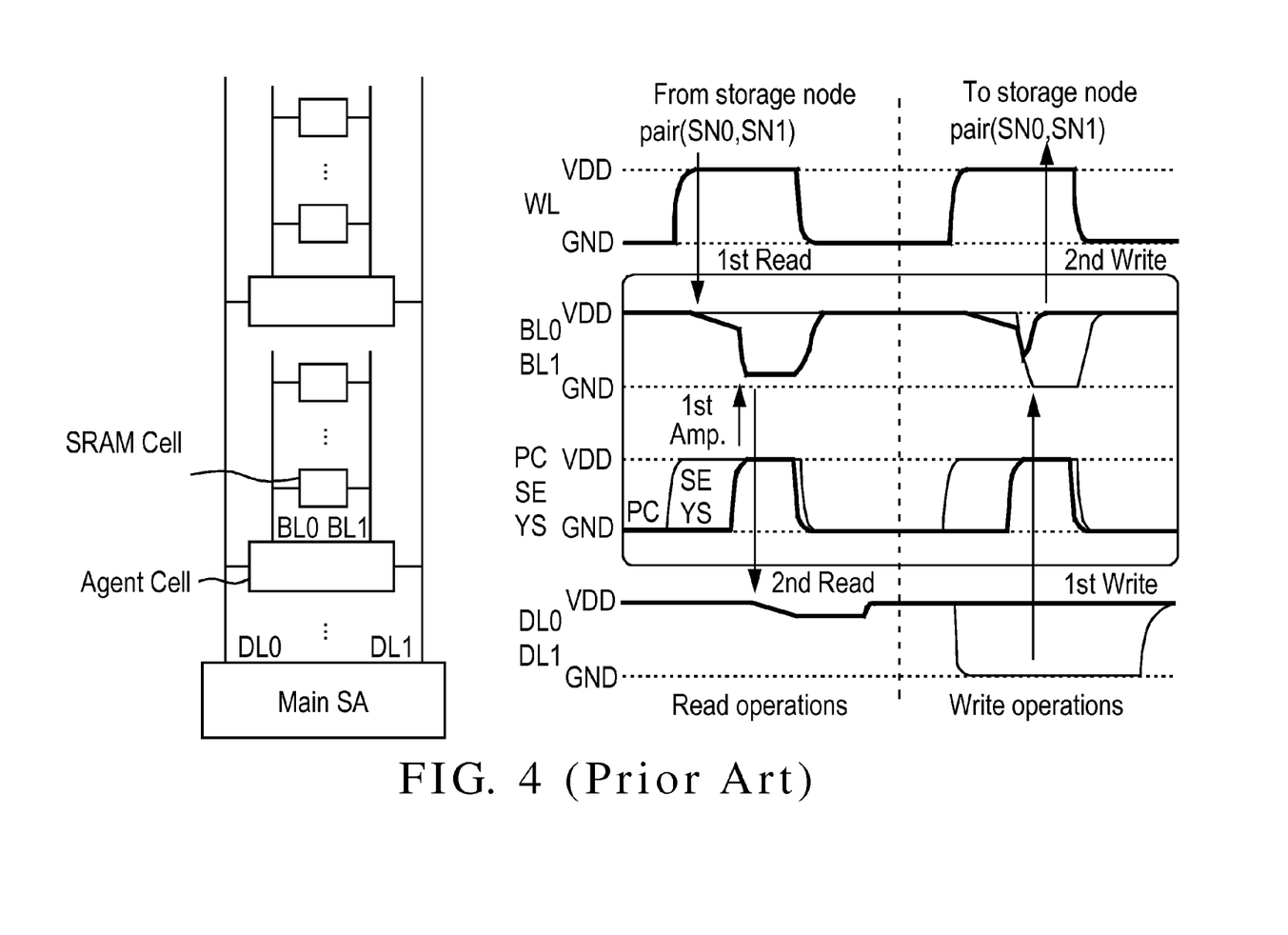
FIG. 4 schematically illustrates another operation of local bit lines with a global bit line.

The article "Multi-step Word-line Control Technology in Hierarchical Cell Architecture for Scaled-down High-density SRAMs" issued by K. Takeda, et al. in Symp. VLSI Circuits, 2010, pp. 101-102 has proposed an agent cell replacing the local sensing amplifier for insulating the LBLs and obtaining the advantages of better sense margin, process variance, and leakage tolerance, as shown in FIG. 4. However, the metal layer is required for the GBL, and the required GBL is too long, which reduces the performance and increases the power consumption.

Therefore, it is desirable to provide an improved SRAM to mitigate and/or obviate the aforementioned problems.

SUMMARY OF THE INVENTION

An object of the present invention is to provide an SRAM, which can increase the SRAM density.

Another object of the present invention is to provide an SRAM, which has a better sense margin, less read-disturb, and improved process variation and current leakage tolerance.

To achieve the objects, the present invention provides a static random access memory, which has a pre-charger, a first cell column array/peripheral circuit, and a first ripple buffer. The pre-charger is connected to a first local bit line in order to pre-charge the first local bit line. The first cell column array/peripheral circuit is connected to the first local bit line and has a plurality of cells for temporarily storing data. The cells are connected to the first local bit line. The first ripple buffer is connected to the first local bit line and a second local bit line in order to send the data from the first local bit line to the second local bit line.

DETAILED DESCRIPTION OF THE PREFERRED EMBODIMENT

Figure 5:
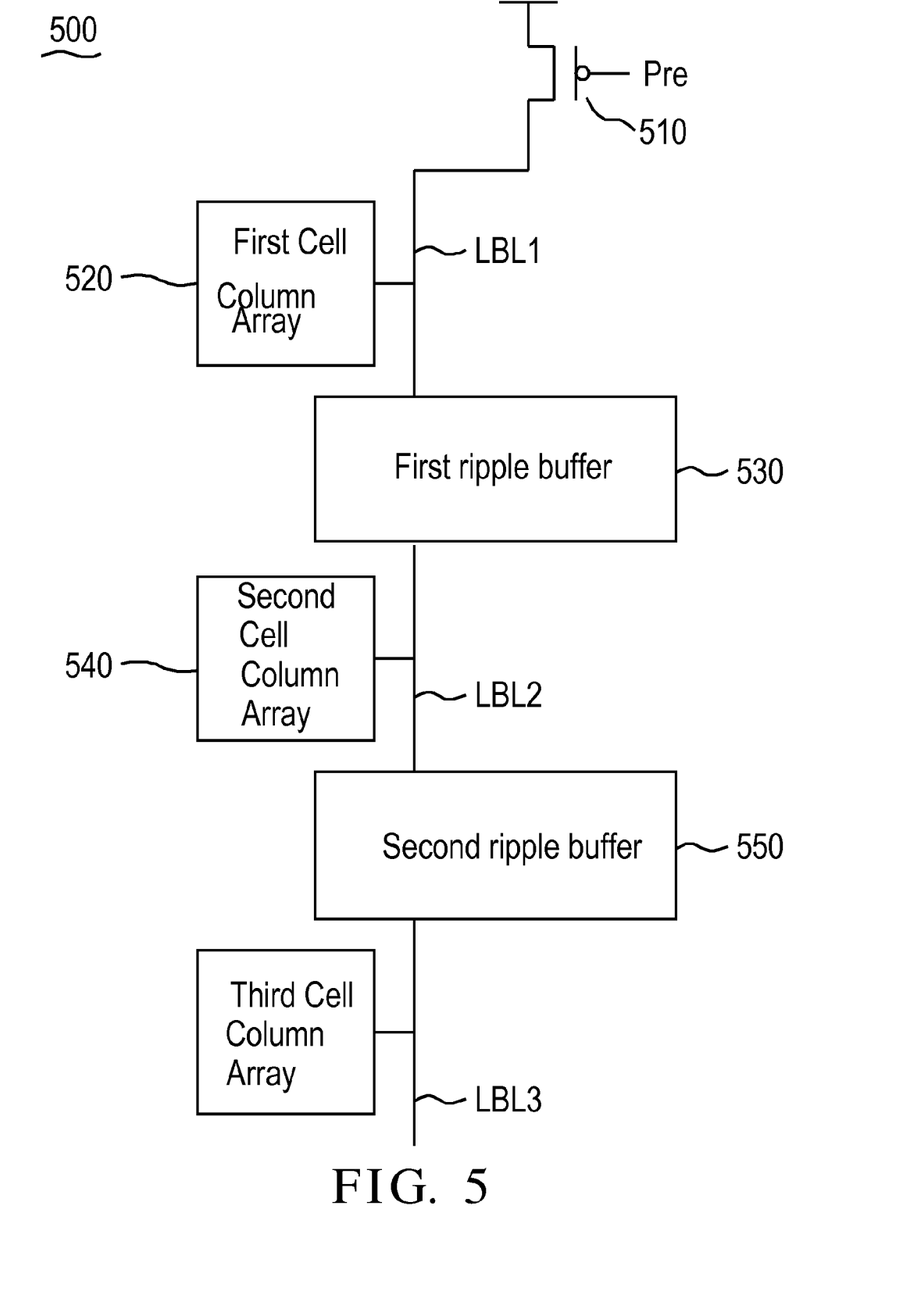
FIG. 5 is a schematic diagram of a static random access memory according to the invention.

FIG. 5 is a schematic diagram of a static random access memory (SRAM) 500 according to the invention. In FIG. 5, the SRAM 500 includes a pre-charger 510, a first cell column array/peripheral circuit 520, a first ripple buffer 530, a second cell column array/peripheral circuit 540, and a second ripple buffer 550.

The pre-charger 510 is connected to a first local bit line LBL1 in order to pre-charge the first local bit line LBL1.

The first cell column array/peripheral circuit 520 is connected to the first local bit line LBL1 and has a plurality of cells (not shown) for temporarily storing data. The cells are connected to the first local bit line LBL1.

The first ripple buffer 530 is connected to the first local bit line LBL1 and a second local bit line LBL2 in order to send the data from the first local bit line LBL1 to the second local bit line LBL2.

The second cell column array/peripheral circuit 540 is connected to the second local bit line LBL2 and has a plurality of cells for temporarily storing data. The cells are connected to the second local bit line LBL2.

The second ripple buffer 550 is connected to the second local bit line LBL2 and a third local bit line LBL3 in order to send the data from the second local bit line LBL2 to the third local bit line LBL3.

The second cell column array/peripheral circuit 540 has a configuration identical to the first cell column array/peripheral circuit 520, and the second ripple buffer 550 has a configuration identical to the first ripple buffer 530.

The SRAM 500 of the invention can repeatedly use the local bit lines and ripple buffers to connect the cell column arrays in series.

Figure 6:
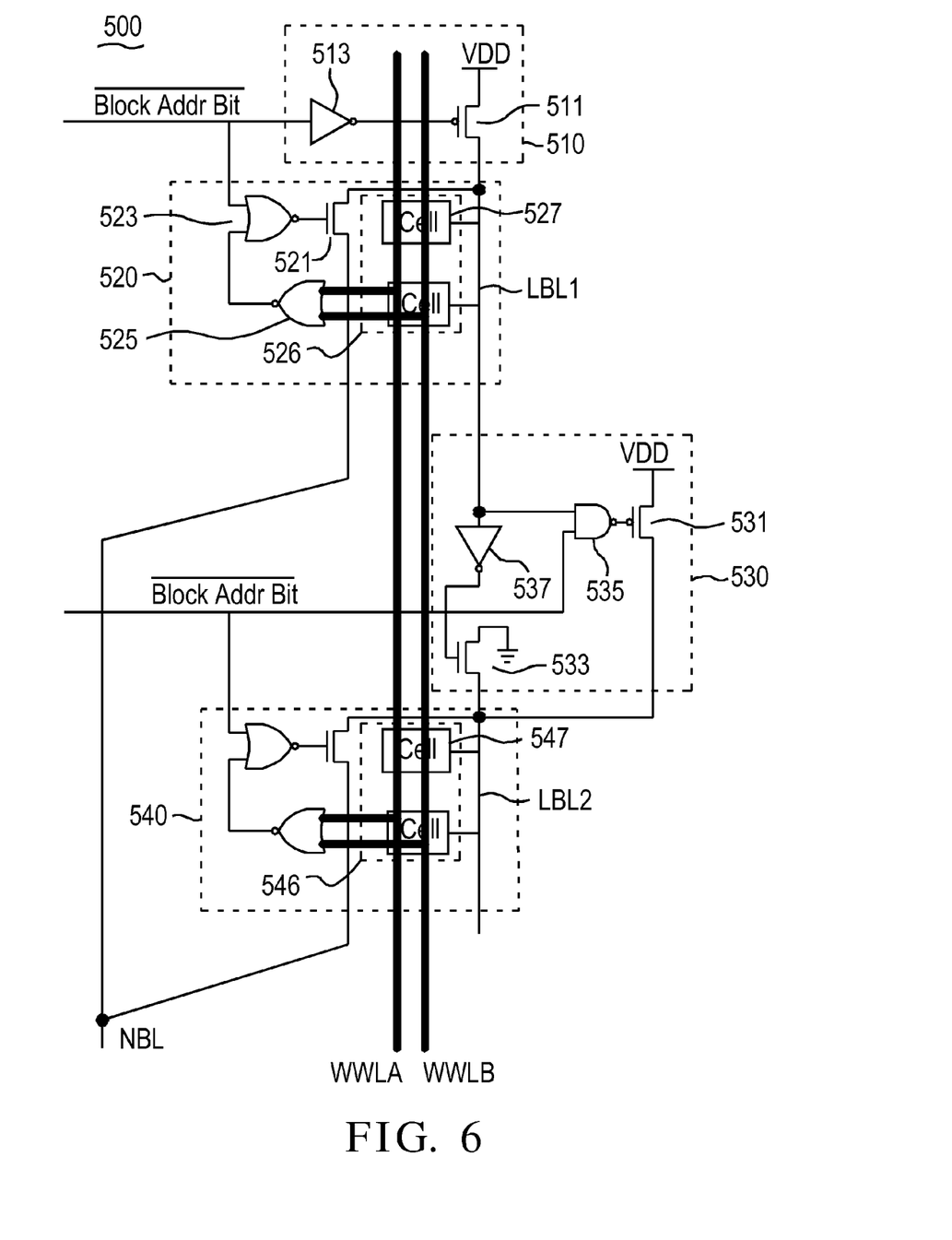
FIG. 6 schematically illustrates an operation of a ripple buffer between two local bit lines.

FIG. 6 is a schematic diagram illustrating an operation of a ripple buffer between two local bit lines. The pre-charger 510 is comprised of a first PMOS transistor 511 and a first inverter 513. The first cell column array/peripheral circuit 520 has a first cell column array 526 with a plurality of cells 527.

The first inverter 513 has an input terminal connected to a select signal $\overline{\text{BlockAddrBit}}$ for the first cell column array 526, and an output terminal connected to a gate of the first PMOS transistor 511. The first PMOS transistor 511 has a source connected to a high voltage VDD, and a drain connected to the first local bit line LBL1.

When the select signal $\overline{\text{BlockAddrBit}}$ for the first cell column array 526 is not active, the first PMOS transistor 511 is turned on, such that the high voltage VDD can pre-charge the first local bit line LBL1. Namely, when the select signal $\overline{\text{BlockAddrBit}}$ is at a high voltage, the output terminal of the first inverter 513 is at a low voltage, and the first PMOS transistor 511 is turned on.

When the select signal $\overline{\text{BlockAddrBit}}$ is active, the first PMOS transistor 511 is turned off, such that the first local bit line LBL1 is at a floating state. Namely, when the select signal $\overline{\text{BlockAddrBit}}$ is at a low voltage, the output terminal of the first inverter 513 is at a high voltage, and the first PMOS transistor 511 is turned off, such that the first local bit line LBL1 is at a floating state.

The first ripple buffer 530 is comprised of a second PMOS transistor 531, an NMOS transistor 533, a NAND gate 535, and a second inverter 537.

The second inverter 537 has an input terminal connected to the first local bit line LBL1, and an output terminal connected to a gate of the NMOS transistor 533. The NMOS transistor 533 has a drain connected to a low voltage, and a source connected to the second local bit line LBL2. The NAND gate 535 has an input terminal connected to the first local bit line LBL1, another input terminal connected to a select signal $\overline{\text{BlockAddrBit}}$ for a second cell column array 546 of the second cell column array/peripheral circuit 540, and an output terminal connected to a gate of the second PMOS transistor 531. The second PMOS transistor 531 has a source connected to the high voltage VDD, and a drain connected to the second local bit line LBL2.

When the select signals $\overline{\text{BlockAddrBit}}$ for the first cell column arrays 526 and 546 are not active (high voltage), the first local bit line LBL1 is pre-charged to the high voltage VDD, such that the output terminal of the NAND gate 535 is at a low voltage, and the second PMOS transistor 531 is turned on. Thus, the second local bit line LBL2 is pre-charged by the high voltage VDD.

When the select signal $\overline{\text{BlockAddrBit}}$ for the second cell column array 546 is active, the second PMOS transistor 531 is turned off, and the second local bit line LBL2 is at a floating state.

When the select signal $\overline{\text{BlockAddrBit}}$ for the first cell column array 526 is active, the first local bit line LBL1 is at a floating state, and when the first cell column array 526 outputs a signal at a low voltage, the first local bit line LBL1 is pulled down to the low voltage, such that the NAND gate 535 outputs a high voltage and the second PMOS transistor 531 is turned off to make the second local bit line LBL2 floating and the output terminal of the second inverter 537 at a high voltage. Thus, the NMOS transistor 533 is turned on, and the second local bit line LBL2 is at a low voltage, so the first cell column array 526 outputs a signal to the second local bit line LBL2.

When the select signal $\overline{\text{BlockAddrBit}}$ for the first cell column array 526 is active, the first local bit line LBL1 is floating, and when the first cell column array 526 outputs a signal at a high voltage, the first local bit line LBL1 maintains at the high voltage floating state that is pre-charged to the first PMOS transistor 511, and the output terminal of the second inverter 537 is at a low voltage to turn the NMOS transistor 533 off. Thus, the second local bit line LBL2 is at a high voltage, and the first cell column array 526 outputs a signal to the second local bit line LBL2.

As shown in FIG. 6, the first cell column array/peripheral circuit 520 includes a second NMOS transistor 521, a first NOR gate 523, a second NOR gate 525, and a first cell column array 526 with a plurality of cells 527. The first NOR gate 523 has an input terminal connected to the select signal $\overline{\text{BlockAddrBit}}$ for the first cell column array 526, another input terminal connected to the output terminal of the second NOR gate 525, and an output terminal connected to the gate of the second NMOS transistor 521. The second NMOS transistor 521 has a first drain/source connected to the first local bit line LBL1, and a second drain/source connected to a write data line NBL. The second NOR gate 525 has an input terminal connected to a first write word select line WWLA, and another input terminal connected to a second write word select line WWLB.

When the first write word select line WWLA or the second write word select line WWLB is at a high voltage, it indicates that there is data to be written into the cell. In this case, the output terminal of the second NOR gate 525 is at a low voltage. When the first cell column array 526 is selected as a write target, the select signal $\overline{BlockAddrBit}$ for the first cell column array 526 is active (low voltage) to turn on the second NMOS transistor 521, such that the electrical signal (data) on the write data line NBL is sent to the first local bit line LBL1 in order to write the electrical signal (data) on the write data line NBL from the first local bit line LBL1 to the cell 527.

Figure 7:
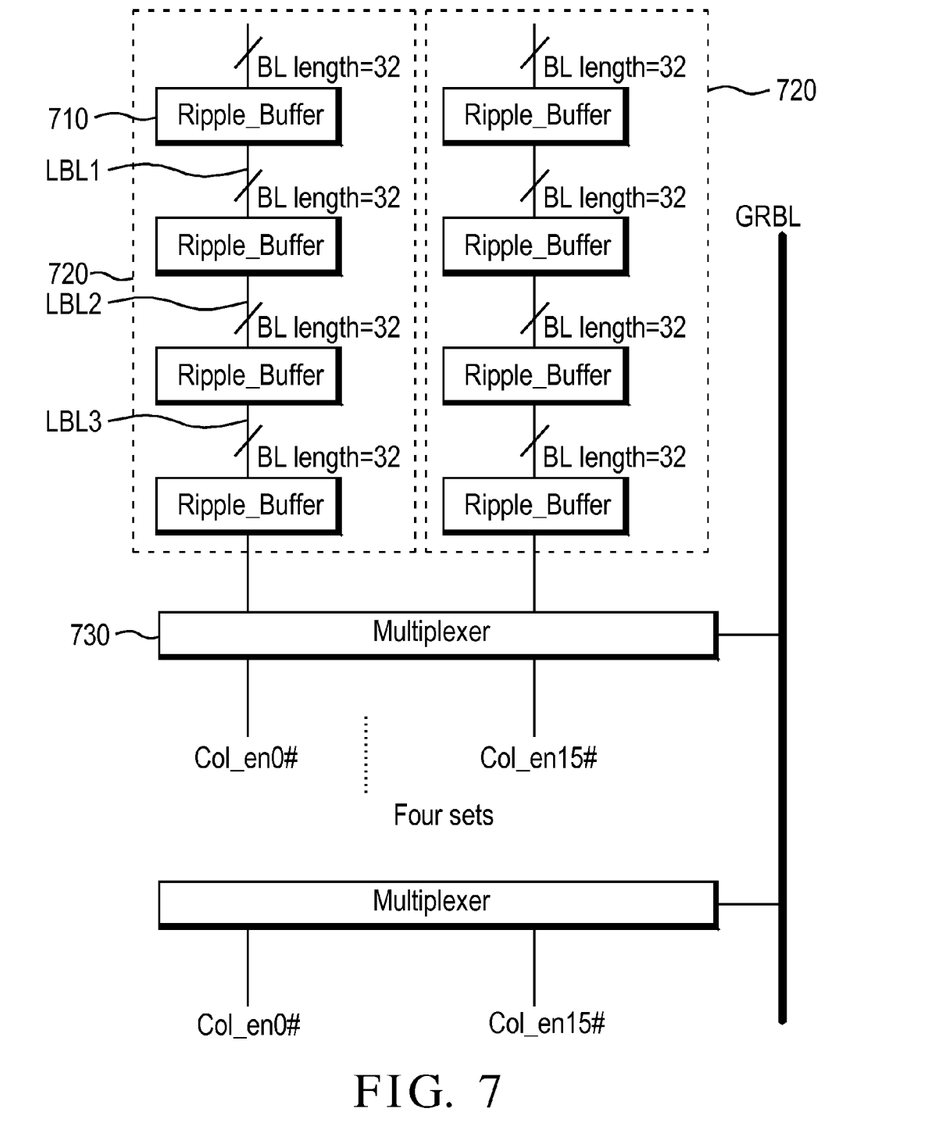
FIG. 7 schematically illustrates another operation of a ripple buffer between two local bit lines.

FIG. 7 is a schematic diagram illustrating another operation of a ripple buffer between two local bit lines. As shown in FIG. 7, a local bit line is used to connect thirty-two cell column arrays, and the ripple buffer 710 connects a plurality of local bit lines in series as a memory column 720. The memory column 720 is connected to a global ripple bit line (GRBL) through a multiplexer 730.

Figure 8:
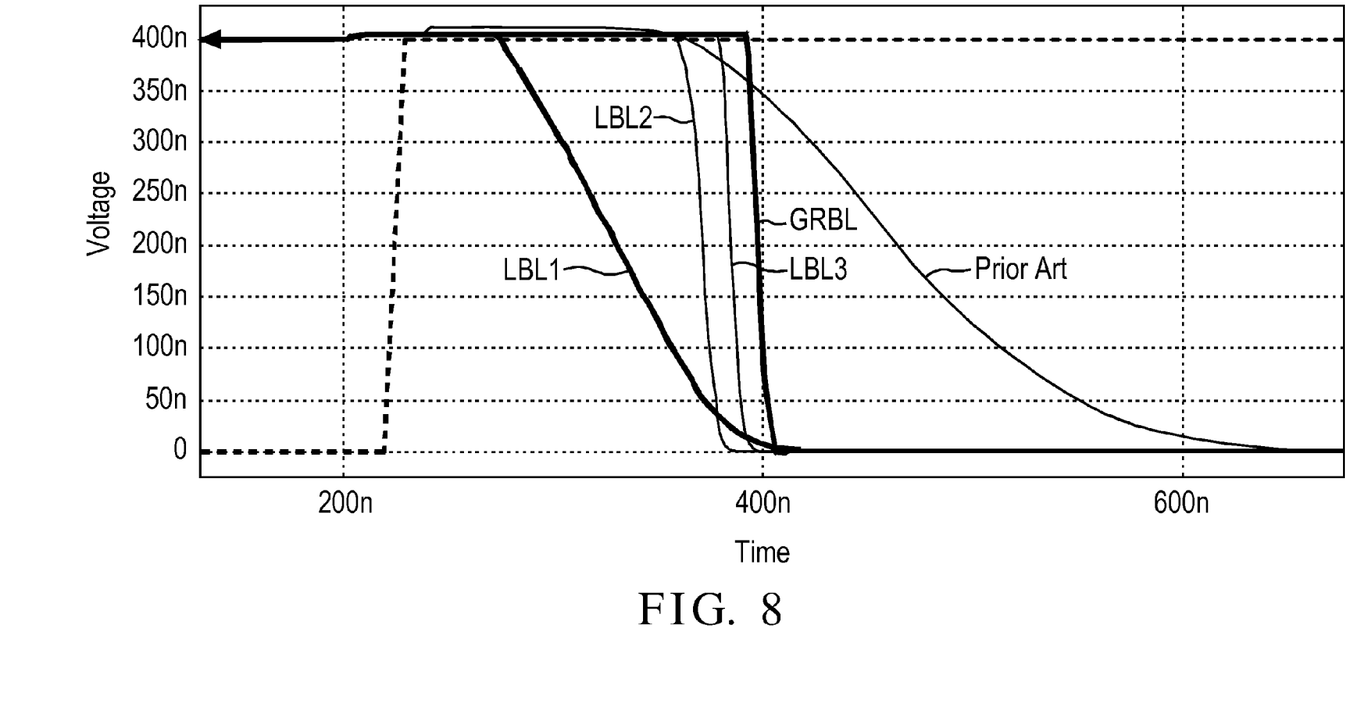
FIG. 8 schematically illustrates a comparison between the invention and the prior art.

FIG. 8 is a schematic graph illustrating a comparison of the invention and the prior art, which is a simulation of LBL1, LBL2, LBL3, GRBL in FIG. 7 and signals in the prior art. The comparison is operated with the conditions of 9T SRAM, 65 nm processing, and 0.4V operating voltage. As shown in FIG. 8, the invention uses the LBLs and ripple buffer, which allows a shorter length of LBLs and a fewer number of connected cells with isolating global bit line loading from LBLs, so as to have less delay time than the prior art and effectively increase the SRAM accessing speed.

Figure 9:
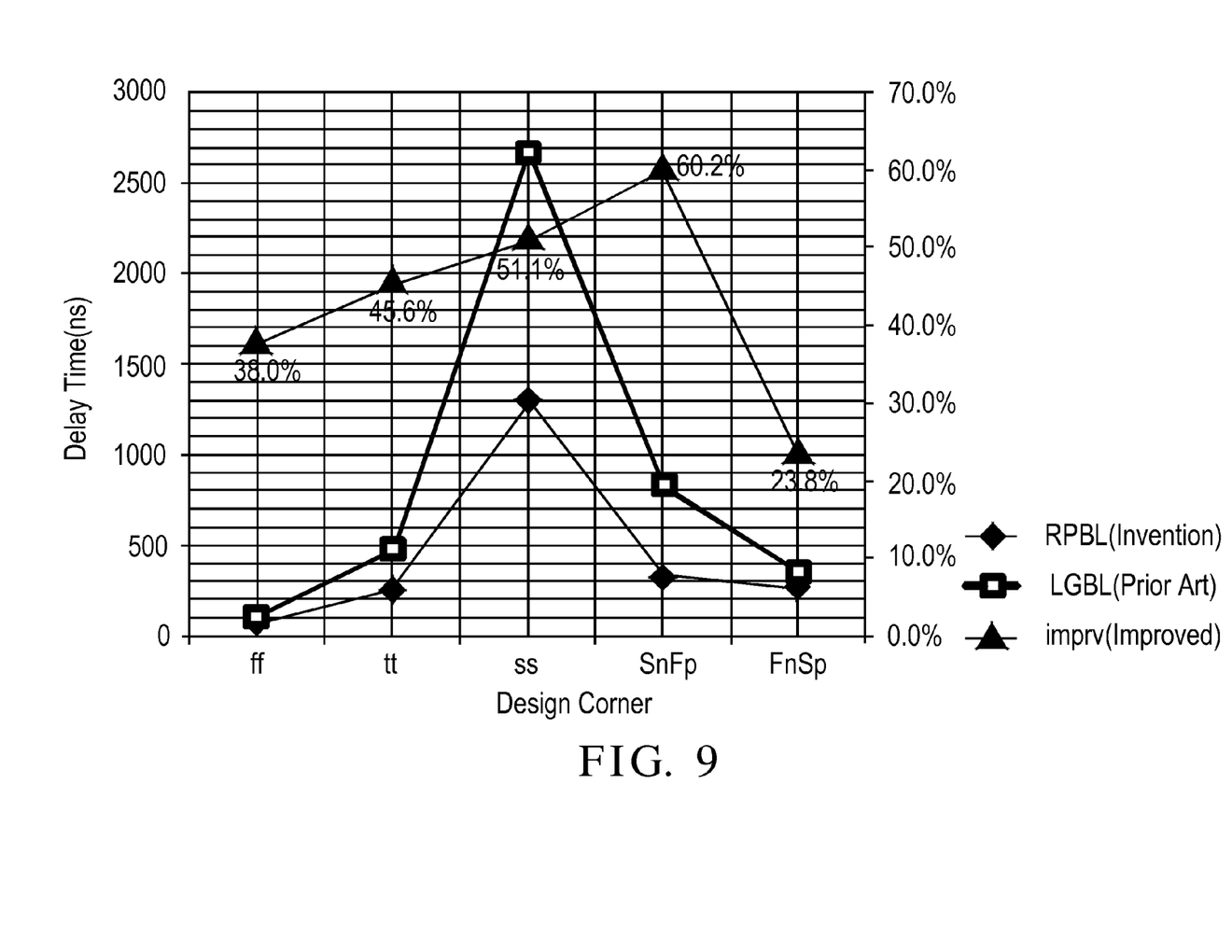
FIG. 9 schematically illustrates a comparison of delay time between the invention and the prior art.

FIG. 9 is a schematic graph illustrating a comparison of delay time between the invention and the prior art. As shown in FIG. 9, at tt (TYPICAL MODEL), the invention has an improved performance of 45.6% more than the prior art.

Figure 10:
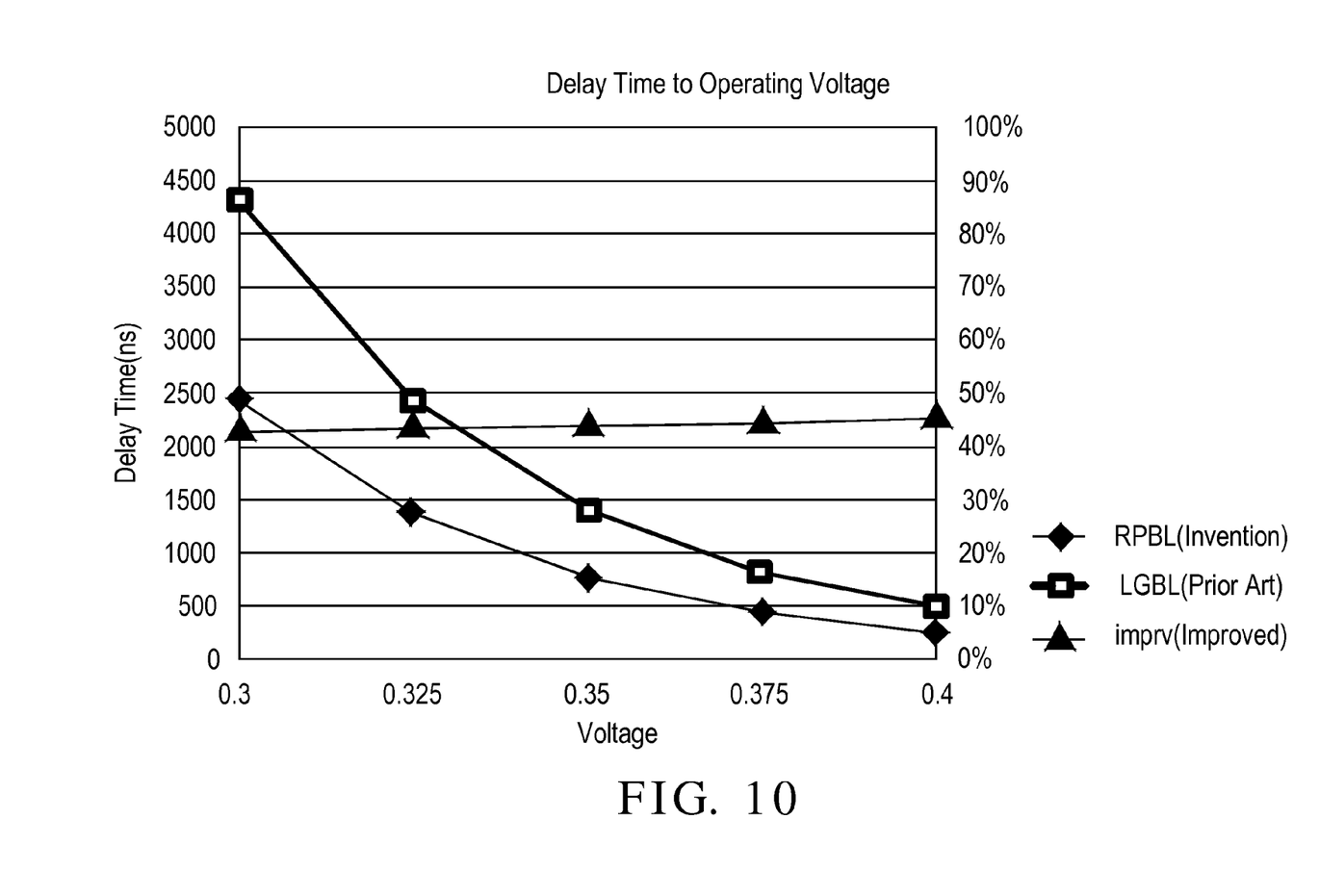
FIG. 10 schematically illustrates a comparison of delay time to operation voltage between the invention and the prior art.

FIG. 10 is a schematic graph illustrating a comparison of delay time to operating voltage between the invention and the prior art. As shown in FIG. 10, at a lower operating voltage (0.3V), the invention has a delay time much less than the prior art. Namely, the invention is more suitable for a future low operating voltage environment than the prior art.

Figure 11:
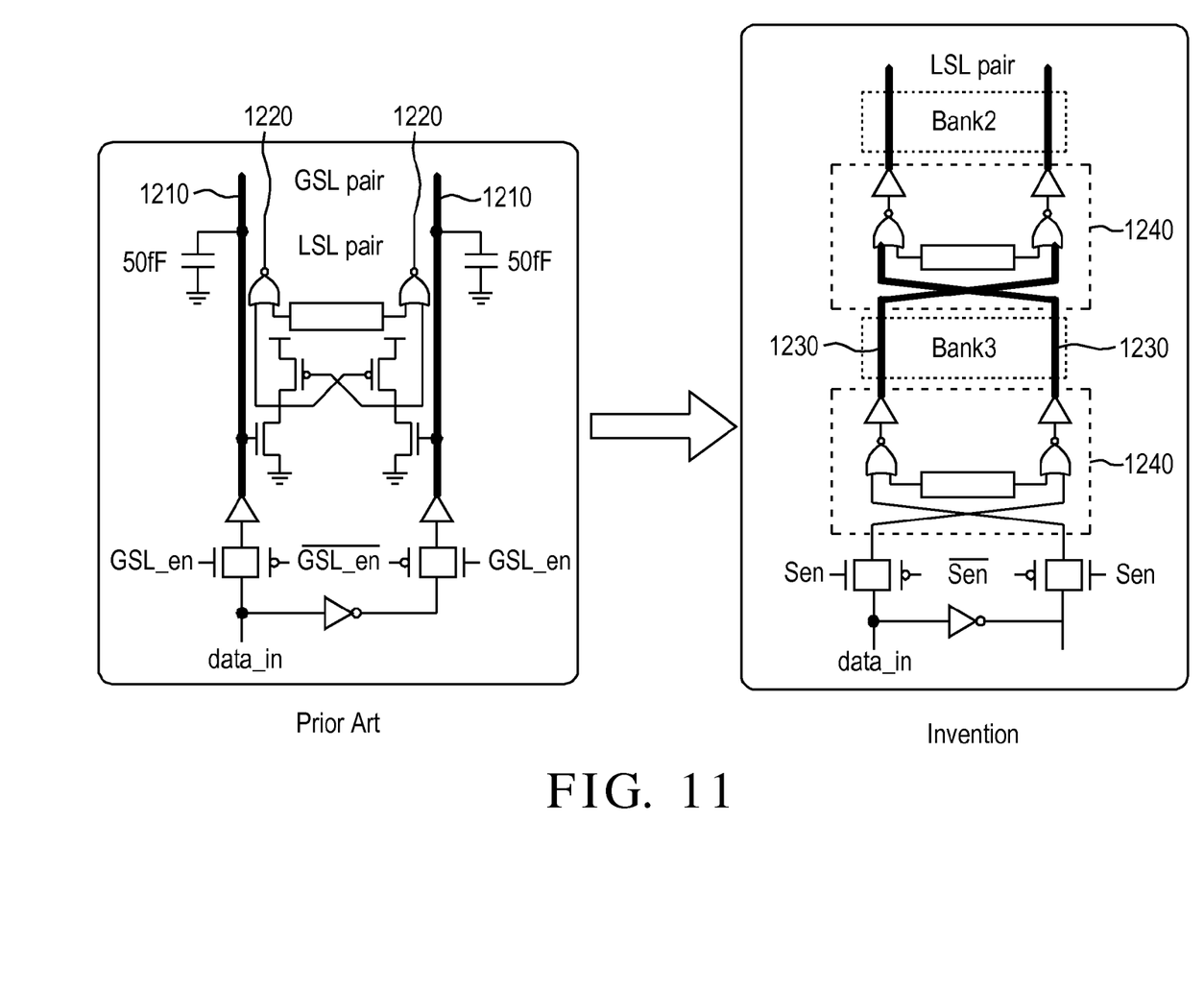
FIG. 11 schematically illustrates a ternary content addressable memory for the invention and the prior art.

The repeatedly used LBL and ripple buffer in the invention can be applied to a ternary content addressable memory. FIG. 11 is a schematic diagram illustrating the ternary content addressable memory for the invention and the prior art. As shown in FIG. 11, the local search line 1220 and global search line 1210 in the prior art are replaced by the local search line 1230 and ripple buffer 1240 in the invention.

Figure 12:
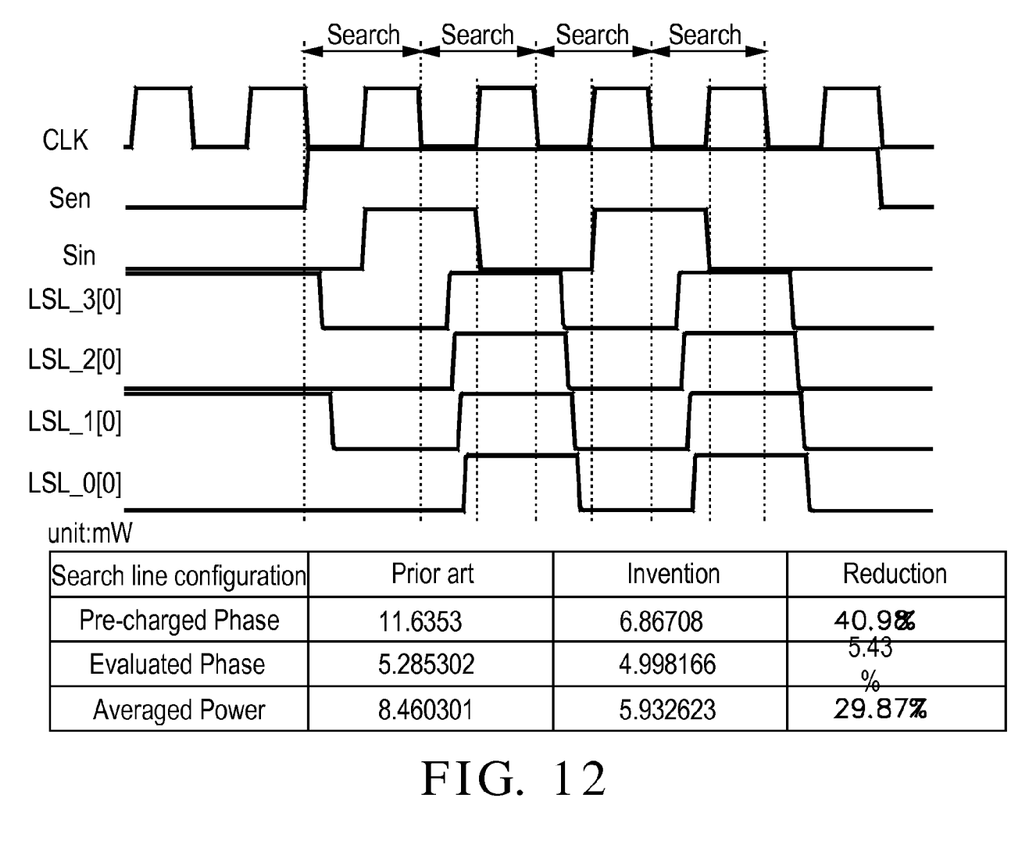
FIG. 12 schematically illustrates a power comparison of search lines between the invention and the prior art.

FIG. 12 is a schematic diagram illustrating a power comparison of search lines between the invention and the prior art. At the pre-charged phase, the invention can reduce 40.98% of the power consumption than the prior art. The averaged power is reduced 29.877% than the prior art.

As cited, the invention uses the LBLs and ripple buffer to thus obtain the better sense margin, sense speed, and less read-disturb than the prior art. Since the LBL becomes shorter, the improved process variation and current leakage tolerance is obtained. Also, the invention connects the LBLs and ripple buffer in series without using the GBL, which can increase the SRAM density and eliminate the metal layer required for the GBLs, as compared with the three articles described in the prior art.

It is known from the simulation that the invention has less delay time than the prior art, which can effectively increase the SRAM accessing speed. Thus, the invention is more suitable for a future low operating voltage environment than the prior art.

It is known from FIG. 6 that the invention uses a single-ended sensing amplifier without requiring a dual-ended sensing amplifier as in the prior art, which can relatively reduce the area required for the peripheral circuit.

Although the present invention has been explained in relation to its preferred embodiment, it is to be understood that many other possible modifications and variations can be made without departing from the spirit and scope of the invention as hereinafter claimed.

What is claimed is:

1. A static random access memory, comprising:
a pre-charger connected to a first local bit line for pre-charging the first local bit line, wherein the pre-charger is comprised of a first PMOS transistor and a first inverter;
a first cell column array/peripheral circuit connected to the first local bit line and having a plurality of cells for temporarily storing data, the cells being connected to the first local bit line;
a first ripple buffer connected to the first local bit line and a second local bit line for sending the data from the first local bit line to the second local bit line, wherein the first ripple buffer is comprised of a second PMOS transistor, an NMOS transistor, a NAND gate, and a second inverter;
a second cell column array/peripheral circuit connected to the second local bit line and having a plurality of cells for temporarily storing data, the cells being connected to the second local bit line; and
a second ripple buffer connected to the second local bit line and a third local bit line for sending the data from the second local bit line to the third local bit line;
wherein the first cell column array/peripheral circuit has a first cell column array with the plurality of cells, and the second cell column array/peripheral circuit has a first cell column array with the plurality of cells.

2. The static random access memory as claimed in claim 1, wherein the first inverter has an input terminal connected to a select signal for the first cell column array and an output terminal connected to a gate of the first PMOS transistor, and the first PMOS transistor has a source connected to a high voltage and a drain connected to the first local bit line.

3. The static random access memory as claimed in claim 2, wherein, when the select signal for the first cell column array is not active, the first PMOS transistor is turned on, and the high voltage pre-charges the first local bit line.

4. The static random access memory as claimed in claim 3, wherein, when the select signal for the first cell column array is active, the first PMOS transistor is turned off, and the first local bit line is at a floating state.

5. The static random access memory as claimed in claim 1, wherein the second inverter has an input terminal connected to the first local bit line and an output terminal connected to a gate of the NMOS transistor, the NMOS transistor has a source connected to the second local bit line and a drain connected to a low voltage, the NAND gate has an input terminal connected to the first local bit line, another input terminal connected to the select signal for the second cell column array, and an output terminal connected to a gate of the second PMOS transistor, and the second PMOS transistor has a source connected to the high voltage and a drain connected to the second local bit line.

6. The static random access memory as claimed in claim 5, wherein, when the select signal for the second cell column array is not active, the second PMOS transistor is turned on, and the high voltage pre-charges the second local bit line.

7. The static random access memory as claimed in claim 6, wherein, when the select signal for the second cell column array is active, the second PMOS transistor is turned off, and the second local bit line is at a floating state.

8. The static random access memory as claimed in claim 7, wherein the first LBL is at the floating state when the select signal for the first cell column array is active, and the first LBL is pulled down to a low voltage when the first cell column array outputs a signal at the low voltage, such that the output terminal of the second inverter is at a high voltage to turn on the NMOS transistor and change the second local bit line to a low voltage thereby sending an output signal of the first cell column array to the second local bit line.

9. The static random access memory as claimed in claim 8, wherein the first local bit line is at the floating state when the select signal for the first cell column array is active, and the first local bit line is maintained at a high voltage when the first cell column array outputs a signal at the high voltage, such that the output terminal of the second inverter is at a low voltage to turn off the NMOS transistor and change the second local bit line to a high voltage thereby sending an output signal of the first cell column array to the second local bit line.

10. The static random access memory as claimed in claim 9, wherein the second and the first cell column arrays have same configuration, and the second and the first ripple buffers have same configuration.

\* \* \* \* \*